US007951692B2

(12) United States Patent
Murakami et al.

(10) Patent No.: US 7,951,692 B2
(45) Date of Patent: May 31, 2011

(54) METHOD OF PRODUCING SEMICONDUCTOR SUBSTRATE HAVING AN SOI STRUCTURE

(75) Inventors: Satoshi Murakami, Tokyo (JP); Nobuyuki Morimoto, Tokyo (JP); Hideki Nishihata, Tokyo (JP); Akihiko Endo, Tokyo (JP)

(73) Assignee: Sumco Corporation, Tokyo (JP)

( * ) Notice: Subject to any disclaimer, the term of this patent is extended or adjusted under 35 U.S.C. 154(b) by 107 days.

(21) Appl. No.: 12/270,753

(22) Filed: Nov. 13, 2008

(65) Prior Publication Data

US 2009/0075453 A1 Mar. 19, 2009

Related U.S. Application Data

(62) Division of application No. 11/796,005, filed on Apr. 25, 2007, now Pat. No. 7,795,117.

(30) Foreign Application Priority Data

May 25, 2006 (JP) ................................. 2006-145718

(51) Int. Cl.
*H01L 21/322* (2006.01)
*H01L 21/301* (2006.01)
(52) U.S. Cl. ........ 438/473; 438/455; 438/458; 438/475; 438/526; 438/530; 257/E21.561; 257/E21.567; 257/E21.568; 257/E21.57
(58) Field of Classification Search .................. 438/455, 438/458, 471, 473–476, 480, 514, 515, 522, 438/526–528, 530, 558, 795, 799, 974; 257/E21.561, E21.567, E21.568, E21.57
See application file for complete search history.

(56) References Cited

U.S. PATENT DOCUMENTS

| 7,625,808 | B2 * | 12/2009 | Endo et al. ..................... 438/455 |
| 7,713,838 | B2 * | 5/2010 | Endo et al. ..................... 438/458 |
| 7,713,842 | B2 * | 5/2010 | Nishihata et al. ............. 438/459 |
| 7,795,117 | B2 * | 9/2010 | Murakami et al. ............ 438/473 |
| 7,851,337 | B2 * | 12/2010 | Murakami et al. ............ 438/480 |
| 2002/0187619 | A1 * | 12/2002 | Kleinhenz et al. ............ 438/471 |
| 2005/0003648 | A1 * | 1/2005 | Mitani et al. .................. 438/612 |
| 2006/0063353 | A1 | 3/2006 | Akatsu |
| 2006/0128116 | A1 | 6/2006 | Kwon et al. |

FOREIGN PATENT DOCUMENTS

EP 0 940 847 A2 9/1999

* cited by examiner

*Primary Examiner* — Matthew C Landau
*Assistant Examiner* — Maliheh Malek
(74) *Attorney, Agent, or Firm* — Sughrue Mion, PLLC

(57) ABSTRACT

There is provided a method for suppressing the occurrence of defects such as voids or blisters even in the laminated wafer having an oxide film of a thickness thinner than the conventional one, wherein hydrogen ions are implanted into a wafer for active layer having an oxide film of not more than 50 nm in thickness to form a hydrogen ion implanted layer, and ions other than hydrogen are implanted up to a position that a depth from the surface side the hydrogen ion implantation is shallower than the hydrogen ion implanted layer, and the wafer for active layer is laminated onto a wafer for support substrate through the oxide film, and then the wafer for active layer is exfoliated at the hydrogen ion implanted layer.

2 Claims, 6 Drawing Sheets

METHOD OF PRODUCING SEMICONDUCTOR SUBSTRATE HAVING AN SOI STRUCTURE

CROSS-REFERENCE TO RELATED APPLICATION

This is a divisional of application Ser. No. 11/796,005 filed Apr. 25, 2007. The entire disclosure of the prior application, application Ser. No. 11/796,005 is hereby incorporated by reference in its entirety.

BACKGROUND OF THE INVENTION

1. Field of the Invention

This invention relates to a method of producing a semiconductor substrate through a lamination process, and more particularly to a method of producing a semiconductor substrate through a lamination process at a state that a thickness of a buried oxide film is thin.

2. Description of Related Art

Recently, semiconductor substrates having a SOI structure that silicon layer or so-called SOI layer is formed on an oxide film are applied as a wafer for a high-performance LSI in electron devices because they are adaptable for speeding up the device and are low in the power consumption and excellent in the pressure resistance, resistance to environment and the like.

As the production method of the semiconductor substrate, there are known a so-called SIMOX method wherein a silicon wafer is implanted with oxygen ions at a high concentration and then subjected to a heat treatment at a high temperature to form an oxide film therein, and a method called as a so-called lamination process. In the lamination process, an oxide film is formed on at least one of a wafer for an active layer forming SOI layer and a wafer for a support substrate and both the wafers are laminated to each other through the oxide film and thereafter the wafer for the active layer is thinned to produce a semiconductor substrate in which SOI layer is formed on the buried oxide film as an insulating film.

Further, the lamination process can be classified into a grind polishing method, a PACE (Plasma Assisted Chemical Etching) method, an ion implantation exfoliation method (which is called as Smart Cut (registered trademark) method), an ELTRAN method and so on. Among them, the ion implantation exfoliation method is frequently used because the crystallinity of the active layer and the thickness uniformity of the active layer are good and the good surface flatness is obtained.

The production procedure of the semiconductor substrate through the lamination process is shown in FIG. 1. That is, a wafer 1 for an active layer and a wafer 2 for a support substrate are previously provided (step (a)), and an oxide film 3 is formed on at least one of both the wafers (the wafer 1 for the active layer in the illustrated embodiment) (step (b)), and then hydrogen ions (or inert gas ions) are implanted into the wafer 1 for the active layer to form an ion implanted layer 4 in the interior of the wafer 1 for the active layer (step (c)). Thereafter, the ion implanted face of the wafer 1 for the active layer is laminated onto the wafer 2 for the support substrate through the oxide film 3 (step (d)), and subjected to an exfoliation heat treatment to partly exfoliate the wafer 1 for the active layer at the ion implanted layer as a cleavage face (exfoliation face) (step (e)), and thereafter re-oxidation treatment is conducted for removing a damaged layer formed on the surface of the active layer (step (f)), and then the planarization treatment is conducted through a step (g) of removing the resulting oxide film to produce a semiconductor substrate 7 in which a silicon layer 6 is formed on a buried oxide film 5.

Lately, it is required to produce SOI wafers having a higher quality in association with the high integration of the semiconductor devices. For this end, it is increasingly demanded to make the thickness of the buried oxide film thinner, for example, up to a thickness of about 20 nm, or to directly laminate the silicon wafers to each other without utilizing the oxide film as to the laminated wafer.

When the laminated wafer is produced by thinning the buried oxide film or without forming the oxide film through the ion implantation exfoliation process, the wafer for the active layer and the wafer for the support substrate are laminated to each other by thinning the oxide film to be formed on either of the wafers or without forming the oxide film.

In the production of the laminated wafer having a thin oxide film inclusive of the case that the buried oxide film is not formed, however, when the exfoliation heat treatment is carried out after the lamination, blisters are generated between the wafer for the support substrate and the oxide film, or there are generated voids extending from the oxide film to the active layer.

That is, in the conventional production of the semiconductor substrate through the lamination process, defects such as blisters or voids may be caused at the laminated interface. Particularly, such blister or void defects tend to frequently occur as the thickness of the buried oxide film existing between two semiconductor wafers becomes thinner, which comes into a serious problem in the production of the laminated semiconductor substrate having a thin oxide film or having no oxide film.

As a countermeasure on the frequent occurrence of blisters or voids when the thickness of the buried oxide film existing between the two semiconductor wafers is made thinner, JP-A-2004-259970 proposes that the thickness of the wafer for the active layer is increased to increase the thickness of the active layer to thereby raise the hardness of the active layer.

However, even when the thickness of the active layer is made thick, if the thickness of the buried oxide film is thin, the blisters or voids occur naturally. Also, when the thinning of the active layer is promoted, the thickness of the active layer is thickened at the midway step for the purpose of raising the hardness, which takes a great labor in the subsequent thinning treatment and causes the deterioration of the quality. That is, when the thickness of the active layer at the midway step is thick, it is required to conduct the thinning of the active layer by a treatment of thermal oxidation+removal of oxide film, or by grinding or polishing treatment for obtaining a final desired thickness of the active layer. In the latter case, as the treating quantity (oxidation quantity, etching quantity, grinding or polishing quantity) increases, the thickness uniformity of the active layer is deteriorated.

SUMMARY OF THE INVENTION

It is, therefore, an object of the invention to provide a method for suppressing the occurrence of defects such as voids or blisters even in the production of the laminated wafer having a thickness of an oxide film thinner than that of the conventional oxide film.

The inventors have made various studies on the frequent occurrence of the defect such as voids or blisters when the thickness of the oxide film is thin in the production of the laminated wafer and found the following knowledge.

That is, the voids or blisters are generated due to the fact that hydrogen ions implanted into the active layer are diffused into the laminated interface in the exfoliation heat treatment to form hydrogen gas, which weakens the bonding strength between the wafer for the active layer and the wafer for the support substrate. If the oxide film formed in the wafer for the active layer is thick, the implantation energy in the hydrogen ion implantation becomes large, so that there is caused a phenomenon that hydrogen ions sputter oxygen from the oxide film and hence oxygen is implanted into the active layer.

When the wafer for the active layer is laminated to the wafer for the support substrate and then subjected to the exfoliation heat treatment, it has newly been revealed that oxygen implanted in the active layer traps hydrogen ions to suppress the diffusion of hydrogen into the laminated interface and hence the generation of defects such as voids or blisters. Further, it has been revealed that when a proper amount of oxygen is implanted into the active layer, the wafer for the active layer becomes hard, which contributes to suppress the generation of the voids or blisters.

On the contrary, when the oxide film formed on the wafer for the active layer is made thin for thinning the thickness of the buried oxide film, or when the thickness of the oxide film to be formed is made thin at the step (b) of FIG. 1, the concentration of oxygen sputtered by hydrogen ion implantation at the subsequent step (c) and implanted into the active layer becomes small and hence the diffusion of hydrogen can not be controlled in the exfoliation heat treatment and the defects such as voids or blisters are generated.

Based on the above knowledge, the inventors have made various investigations on a method capable of implanting a proper dose of oxygen into the active layer even when the thickness of the oxide film is made small.

At first, the inventors introduced the following equation (I) in the examination on the above effect of suppressing the hydrogen diffusion by oxygen every factor:

$$N_D = N_{HO} + N_{IO} + N_{ID} \quad (I)$$

where $N_D$: total factor number producing the effect of suppressing hydrogen diffusion, $N_{HO}$: oxygen introduced into active layer through hydrogen ion implantation, $N_{IO}$: oxygen introduced into active layer through ion implantation other than hydrogen, $N_{ID}$: defects introduced into active layer through ion implantation other than hydrogen.

Based on the above equation (I), the inventors have made various cases and sought optimum conditions for avoiding the defects in case that the thickness of the oxide film is thinned.

Firstly, when hydrogen ions are implanted at an implantation energy: 50 keV and a dose: $6 \times 10^6$ atoms/cm² into a wafer for an active layer having an oxide film of usual thickness: 150 nm as the conventional method, a good product having no defect is $N_{HO} = 4.2 \times 10^{14}$ atoms/cm² from data of a secondary ion mass spectrometry (SIMS). Also, since ions other than hydrogen are not implanted, $N_{IO} = 0$ and $N_{ID} = 0$, so that it is sufficient to be $N_D > 4.2 \times 10^{14}$ atoms/cm².

Then, it is considered that the condition for obtaining the good product through only the hydrogen ion implantation is satisfied in case of changing the thickness of the oxide film.

When the condition is $N_{HO} = D_H$(hydrogen dose)$\times t_{box}$ (thickness of oxide film)$\times k_{HO}$(coefficient) ... (II), from $N_{HO} = 4.2 \times 10^{14}$ atoms/cm², $D_H = 6 \times 10^{16}$ atoms/cm² and $t_{box} = 150$ nm is $k_{HO} = 4.2 \times 10^{14} / \{(6 \times 10^{16}) \times (150 \times 10^{-7})\} = 4.67 \times 10^2$ (/cm).

From the above equation (II), a relation between $D_H$ (hydrogen dose) and $t_{box}$ (thickness of oxide film) is $D_H = A \cdot 1/t_{box} A = N_{HO}/k_{HO}$.

The results of the relation arranged by $D_H$ and $t_{box}$ are shown in FIG. 2. In this figure, when the relation exceeds the upper limit of the hydrogen dose, the self-exfoliation occurs, while when it is less than the lower limit, the exfoliation is not caused by the heat treatment, so that it is assumed that the hydrogen dose is set between the upper limit and the lower limit.

In the light of the above relation, if it is intended to thin the oxide film to not more than 50 nm, it is difficult to satisfy $N_D$ only by the hydrogen ion implantation as shown in FIG. 2.

In order to satisfy $N_D$, therefore, it has been found that it is necessary to supplement a portion not satisfied by the hydrogen ion implantation through an implantation of ions other than hydrogen, and as a result, the invention has been accomplished.

That is, the summary of the invention is as follows.

(1) A method of producing a semiconductor substrate, which comprises the steps of forming an oxide film having a thickness of not more than 50 nm on a wafer for an active layer forming a silicon layer, implanting hydrogen ions into the wafer for the active layer to form a hydrogen ion implanted layer, implanting ions other than hydrogen to a position that a depth from the surface side the hydrogen ion implantation is shallower than the hydrogen ion implanted layer, laminating the wafer for the active layer through the oxide film to a wafer for a support substrate, and then exfoliating the wafer for the active layer at the hydrogen ion implanted layer (first invention).

(2) A method of producing a semiconductor substrate, which comprises forming an oxide film having a thickness of not more than 50 nm on a wafer for an active layer forming a silicon layer, implanting ions other than hydrogen into the wafer for the active layer to a position shallower than an exfoliation region of the wafer for the active layer, implanting hydrogen ions into the exfoliation region to form a hydrogen ion implanted layer, laminating the wafer for the active layer through oxide film to a wafer for a support substrate, and then exfoliating the wafer for the active layer at the hydrogen ion implanted layer (second invention).

(3) A method of producing a semiconductor substrate according to item (1) or (2), wherein a plasma treatment is carried out prior to the lamination of the wafer for the active layer and the wafer for the support substrate.

According to the invention, the semiconductor substrate formed by directly silicon wafers to each other through the oxide film having a thickness thinner than the conventional one or without forming the oxide film can be produced under a stable quality without causing defects such as voids or blisters.

DESCRIPTION OF THE PREFERRED EMBODIMENTS

The invention lies in that when a semiconductor substrate is produced by directly silicon wafers to each other through the oxide film having a thickness thinner than the conventional one or without forming the oxide film, in addition to hydrogen ions for exfoliating the wafer for the active layer, ions other than hydrogen ions are implanted to sputter a necessary quantity of oxygen from the oxide film and implant oxygen into the active layer, and concrete methods therefor are explained individually.

Figure 3:
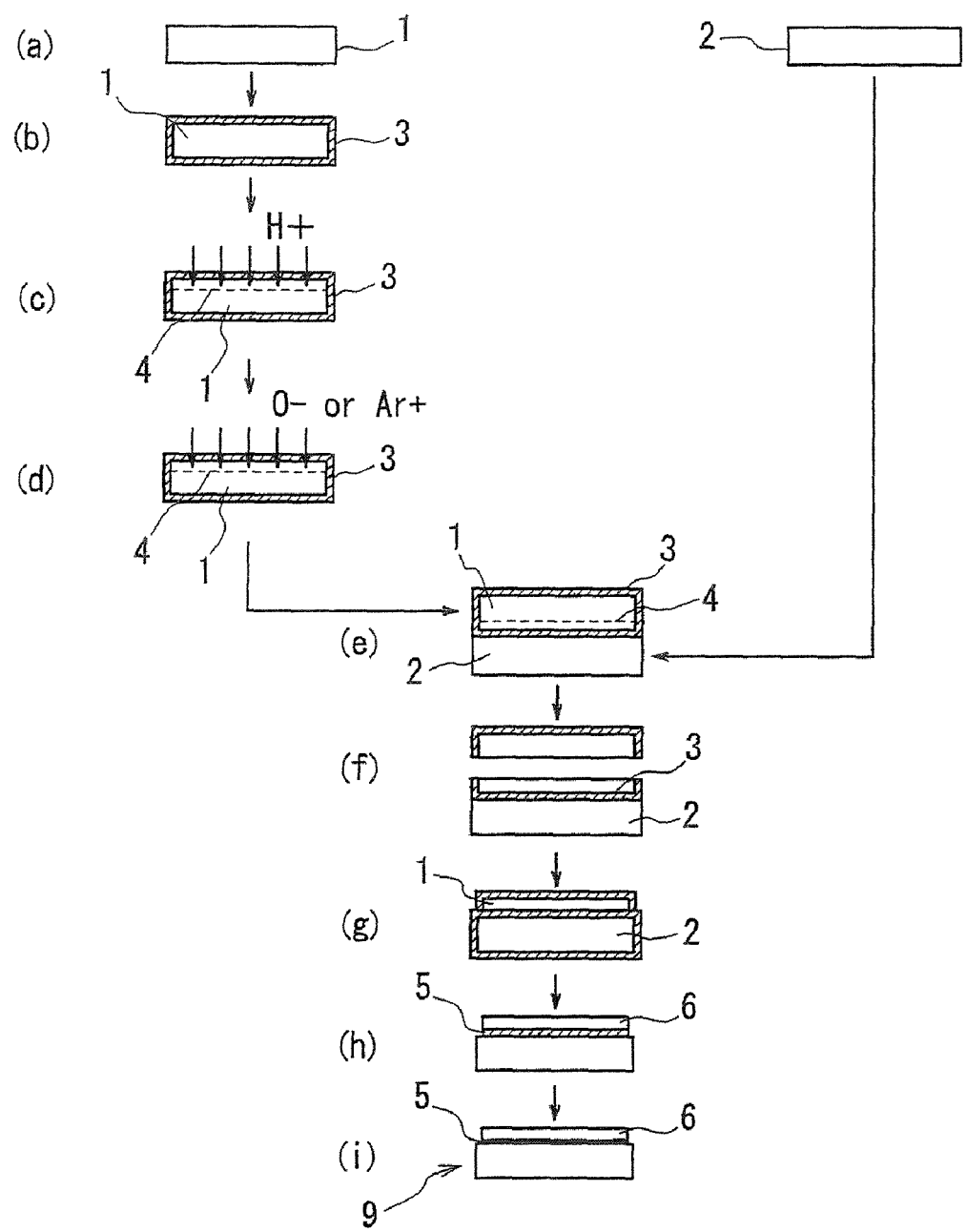
FIG. 3 a flow chart showing procedures of producing a semiconductor substrate according to the invention.

In the method according to the first invention shown in FIG. 3, a wafer 1 for an active layer and a wafer 2 for a support substrate are previously provided (step (a)), and an oxide film 3 is formed on the wafer 1 for the active layer (step (b)), and then hydrogen ions are implanted into the wafer 1 for the active layer to form an ion implanted layer 4 in the interior of the wafer 1 for the active layer (step (c)).

Thereafter, ions other than hydrogen such as oxygen ions or argon ions are implanted to a position that a depth from the surface side the hydrogen ion implantation is shallower than the hydrogen ion implanted layer 4 (step (d)). When the implantation of oxygen ions or argon ions is carried out together with the implantation of hydrogen ions, these ions sputter oxygen from the oxide film to implant oxygen required for suppressing void or blister defects into the active layer.

Then, the wafer 1 for the active layer is laminated through the oxide film 3 at the ion implanted side to the wafer 2 for the support substrate (step (e)), and the exfoliation heat treatment is conducted to partly exfoliate the wafer 1 for the active layer at the ion implanted layer 4 as a cleavage plane (exfoliation face) (step (f)), and thereafter re-oxidation treatment (step (g)), removal of oxide film (step (h)) and planarization treatment (step (i)) are carried out to produce a semiconductor substrate 7 in which a silicon layer 6 is formed on a buried oxide film 5.

As the planarization treatment is suitable a treatment in Ar or $H_2$ atmosphere at a high temperature above 1100° C.

In the above method, the ions other than hydrogen are particularly implanted at the step (d) in addition to the implantation of hydrogen ions at the precedent step, so that the diffusion of hydrogen into the laminated interface at the exfoliation heat treatment of the step (f) is suppressed by oxygen sufficiently sputtered at these steps to suppress the occurrence of voids or blisters, whereby there is obtained the semiconductor substrate having a thin thickness of the oxide film.

The condition for implanting oxygen required for the suppression of void or blister defects in the active layer by conducting the implantation of oxygen ions or argon ions in addition to the implantation of hydrogen ions to sputter oxygen from the oxide film with these ions is explained in detail below.

In order that $N_D$ defined in the above equation (I) satisfies $N_D > 4.2 \times 10^{14}$ atoms/cm$^2$ through the implantation of ions other than hydrogen, it is necessary that a shortage of $N_{HO}$ (oxygen introduced into the active layer by hydrogen ion implantation) is made up by $N_{IO}$ (oxygen introduced into the active layer by element(s) other than hydrogen) and $N_{ID}$ (defects introduced into the active layer by implanting ions other than hydrogen).

Figure 4:
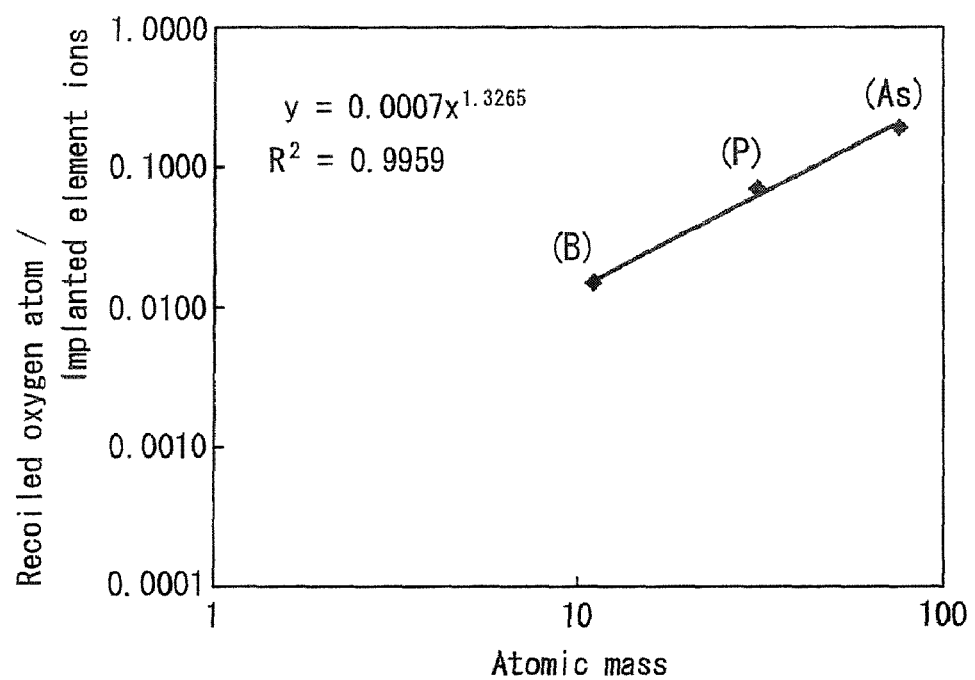
FIG. 4 is a graph showing a relation between atomic mass of each element and a ratio of oxygen atom recoiled to the each element ion in the element implantation.

There are B, P and As as an element generally implanted into the wafer. In Table 1 is shown a dose of oxygen introduced by a recoil phenomenon in the implantation of such an element ion. In FIG. 4 are shown results arranged as a relation between atomic mass of each element and a ratio of oxygen atom recoiled in the implantation of the element to the element ion (recoil ratio). The recoil phenomenon means a phenomenon that when the element ion is implanted through the oxide film, oxygen atom is sputtered from the oxide film by the implanted ion to strike into Si crystal.

From the results of FIG. 4, a recoil ratio $R_Z$ of a certain element can be represented by the following equation (III):

$$R_Z = 0.0007 \times q_Z^{1.325} \tag{III}$$

where $q_Z$ is an atomic mass.

TABLE 1

Thickness of oxide film: 1 nm, Ion dose: $1.00 \times 10^{13}$ atoms/cm$^2$

| Element | Atomic mass | Recoiled oxygen atom/implanted element ion | Oxygen concentration introduced by recoil phenomenon |
|---|---|---|---|
| B | 11 | 0.0150 | $1.50 \times 10^{18}$ |
| P | 31 | 0.0680 | $6.80 \times 10^{18}$ |
| As | 75 | 0.1900 | $1.90 \times 10^{18}$ |

Each recoil ratio of hydrogen, oxygen and argon is determined according to the equation (III) as follows:
Hydrogen: $R_H = 0.0007$ ($q_H = 1$)
Oxygen: $R_O = 0.0277$ ($q_O = 16$)
Argon: $R_{Ar} = 0.0934$ ($q_{Ar} = 40$)

When argon ions are implanted after the hydrogen ion implantation at hydrogen dose: $6 \times 10^{16}$ atoms/cm$^2$ and implantation energy: 50 keV, a relation between implantation dose of argon ions and thickness of oxide film is determined in order that $N_D$ defined in the equation (I) satisfies $N_D > 4.2 \times 10^{14}$ atoms/cm$^2$.

At first, the equation (I) in the implantation of argon ions is represented as follows:

$$N_D = N_{HO} + N_{IO} + N_{ArD} \tag{I}$$

When $N_{HO}$, $N_{ArO}$ and $N_{ArD}$ are $$N_{HO} = D_H(\text{hydrogen dose}) \times t_{box}(\text{thickness of oxide film}) \times k_{HO}(\text{coefficient}) \tag{II}$$

(where $D_H = 6 \times 10^{16}$ atoms/cm$^2$ and $k_{HO} = 4.76 \times 102$ 8/cm)), $$N_{ArO} = D_{Ar}(\text{argon dose}) \times t_{box}(\text{thickness of oxide film}) \times k_{ArO}(\text{coefficient})$$

(where $k_{ArO} = R_{Ar}/R_H \times k_{HO} = 0.0934/0.0007 \times 4.67 \times 10^2 = 6.23 \times 10^4$) and
$N_{ArD} = D_{Ar}$, the above equation (I) is
$N_D = N_{HO} + N_{ArO} + N_{ArD} = D_H \times t_{box} \times k_{HO} + D_{Ar} \times t_{box} \times k_{ArO} + D_{Ar} = 4.2 \times 10^{14}$ atoms/cm$^2$, from which the implantation dose of argon ions is $D_{Ar} = (4.2 \times 10^{14} - 6.0 \times 10^{16} \times t_{box} \times 4.67 \times 10^2)/(t_{box} \times 6.23 \times 10^4 + 1)$.

Similarly, when oxygen ions are implanted after the hydrogen ion implantation at hydrogen dose: $6 \times 10^{16}$ atoms/cm$^2$ and implantation energy: 50 keV, a relation between implantation dose of oxygen ions and thickness of oxide film is determined in order that $N_D$ defined in the equation (I) satisfies $N_D > 4.2 \times 10^{14}$ atoms/cm$^2$.

At first, the equation (I) in the implantation of oxygen ions is represented as follows:

$$N_D = N_{HO} + N_{OO} + N_{OD} \tag{I}$$

When $N_{HO}$, $N_{OO}$ and $N_{OD}$ are $$N_{HO}=D_H(\text{hydrogen dose})\times t_{box}(\text{thickness of oxide film})\times k_{HO}(\text{coefficient}) \quad \text{(II)}$$

(where $D_H=6\times10^{16}$ atoms/cm$^2$ and $k_{HO}=4.76\times10^2$ (/cm)), $$N_{OO}=D_O(\text{oxygen dose})\times t_{box}(\text{thickness of oxide film})\times k_{OO}(\text{coefficient})$$

(where $k_{OO}=R_O/R_H\times k_{HO}=0.0277/0.0007\times4.67\times10^2=1.85\times10^4$) and $N_{OD}=D_O$, the above equation (I) is $N_D=N_{HO}+N_{OO}+N_{OD}=D_H\times t_{box}\times k_{HO}+D_O\times t_{box}\times k_{OO}+D_O=4.2\times10^{14}$ atoms/cm$^2$, from which the implantation dose of oxygen ions is $D_O=(4.2\times10^{14}-6.0\times10^{16}\times t_{box}\times4.67\times10^2)/(t_{box}\times1.85\times10^4+1)$.

Figure 5:
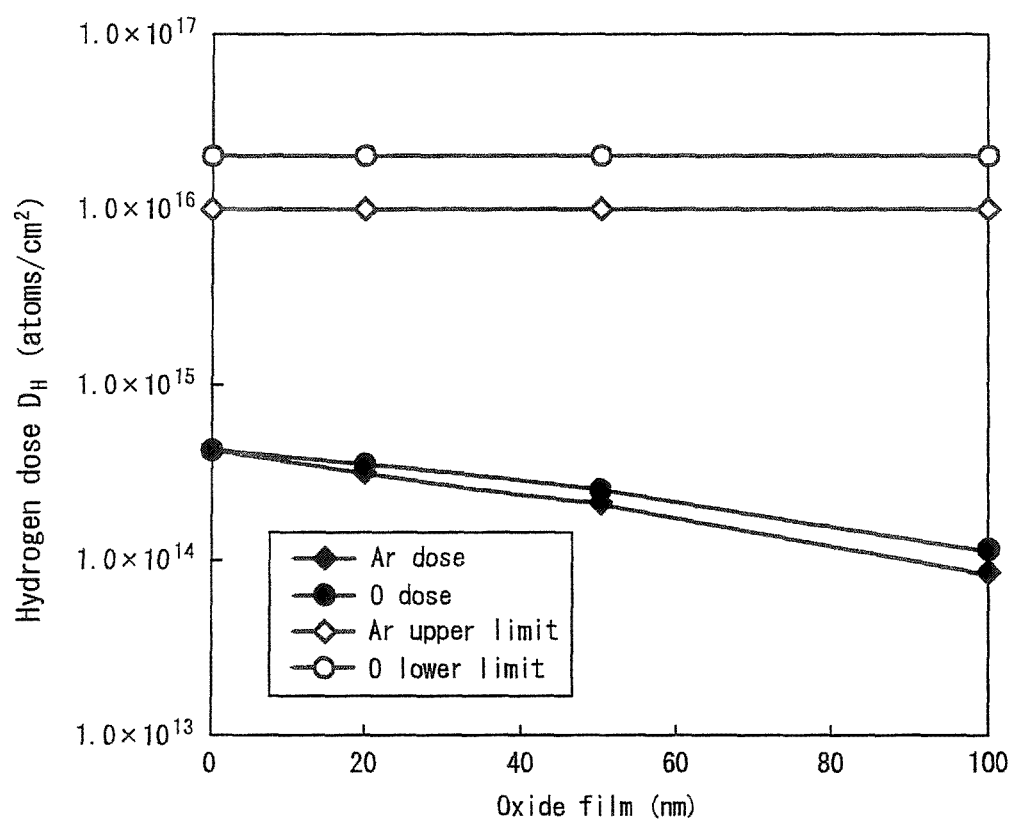
FIG. 5 is a graph showing adequate implantation doses of argon ions and oxygen ions.

In FIG. 5 are shown results obtained by arranging the above adequate implantation doses of argon ions and oxygen ions by the thickness of the oxide film. Although defects are introduced into the active layer by implanting the argon ions or oxygen ions, if the implantation dose is too large, the crystallinity of the active layer is broken and the good active layer is not obtained. From such a viewpoint, there is the upper limit on the implantation doses of argon ions and oxygen ions in FIG. 5. The upper limit is experimentally $1\times10^{16}$ atoms/cm$^2$ in case of the argon ions and $2\times10^{16}$ atoms/cm$^2$ in case of the oxygen ions, respectively.

Figure 6:
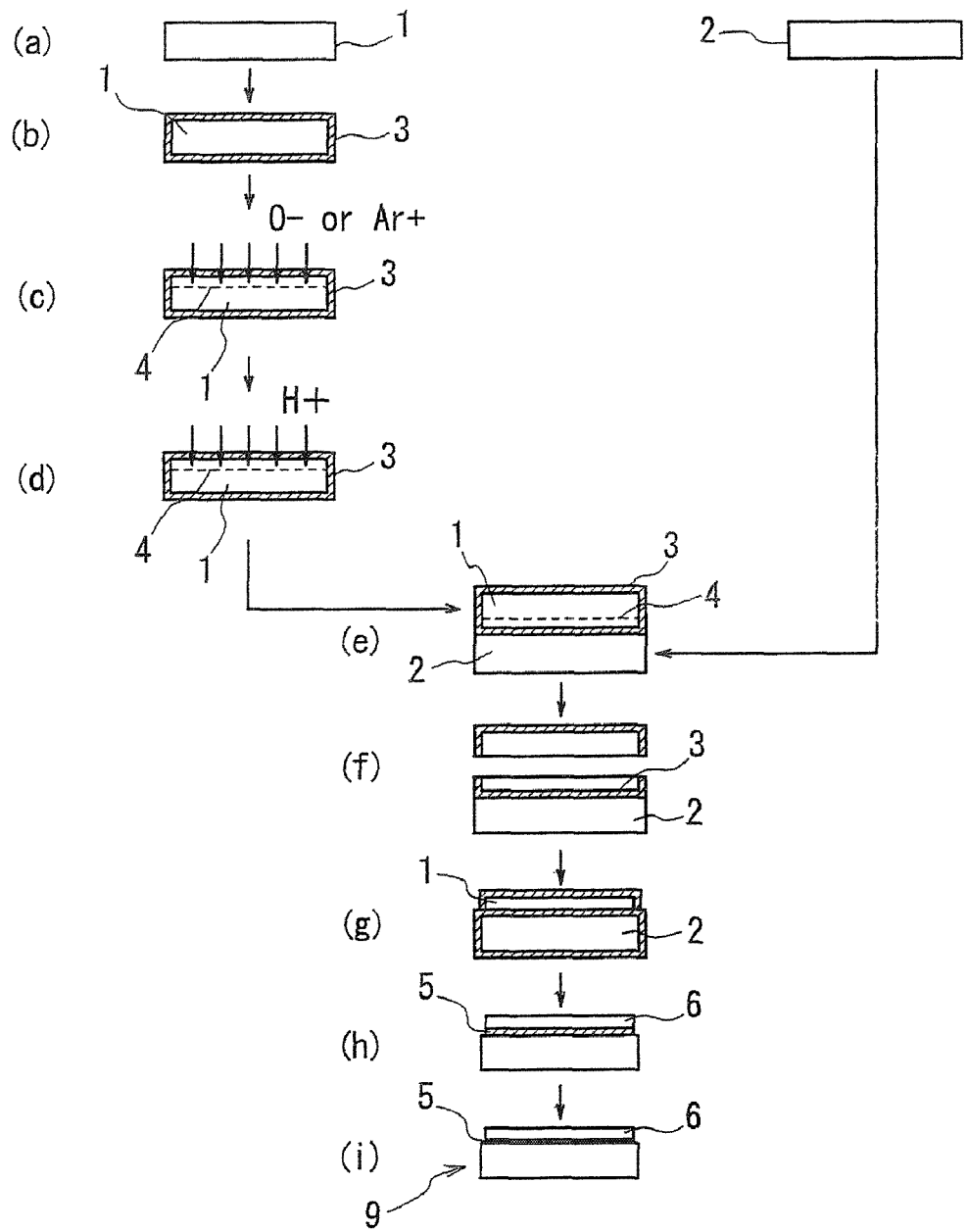
FIG. 6 is a flow chart showing procedures of producing a semiconductor substrate according to the invention.

In the method according to the second invention shown in FIG. 6, a wafer 1 for an active layer and a wafer 2 for a support substrate are previously provided (step (a)). Firstly, an oxide film 3 is formed on the wafer 1 for the active layer (step (b)), and ions other than hydrogen such as oxygen ions or argon ions are implanted into the wafer 1 for the active layer up to a position shallower than an exfoliation region of the wafer 1 for the active layer (step (c)). Thereafter, hydrogen ions are implanted into the exfoliation region to form a hydrogen ion implanted layer 4 (step (d)).

Since the implantation of oxygen ions or argon ions is carried out in addition to the implantation of hydrogen ions, oxygen is sputtered from the oxide film by these ions to implant oxygen required for the suppression of void or blister defects into the active layer.

Then, the wafer 1 for the active layer is laminated through the oxide film 3 at the ion implanted side to the wafer 2 for the support substrate (step (e)), and an exfoliation heat treatment is applied to partly exfoliate the wafer 1 for the active layer at the ion implanted layer 4 as a cleavage plane (exfoliation face) (step (f)), and thereafter re-oxidation treatment (step (g)), removal of oxide film (step (h)) and planarization treatment (step (i)) are carried out to produce a semiconductor substrate 7 in which a silicon layer 6 is formed on a buried oxide film 5.

In the above method, the ions other than hydrogen are particularly implanted at the step (c) in addition to the hydrogen ion implantation at the subsequent step, so that the diffusion of hydrogen into the laminated interface at the exfoliation heat treatment of the step (f) is suppressed by oxygen sufficiently sputtered at these steps to suppress the occurrence of voids or blisters, whereby there is obtained the semiconductor substrate having a thin thickness of the oxide film.

Even in the method of FIG. 6, it is preferable to conduct the implantation of argon ions or oxygen ions within the preferable range shown in FIG. 5.

In any methods shown in FIGS. 3 and 6, it is preferable to conduct a plasma treatment for increasing the adhesion strength at the laminated interface prior to the lamination between the wafer 1 for the active layer and the wafer 2 for the support substrate. Since the plasma treatment has effects of activating the laminated surface and removing organic substance adhered to the surface, the adhesion strength of the laminated interface is improved to bring about the decrease of voids or blisters. Moreover, the conditions of the plasma treatment are not particularly limited, but the similar effects can be typically developed by treating the wafers in a gas atmosphere of oxygen, nitrogen, hydrogen or the like for several tens seconds.

Comparative Example 1

Figure 1:
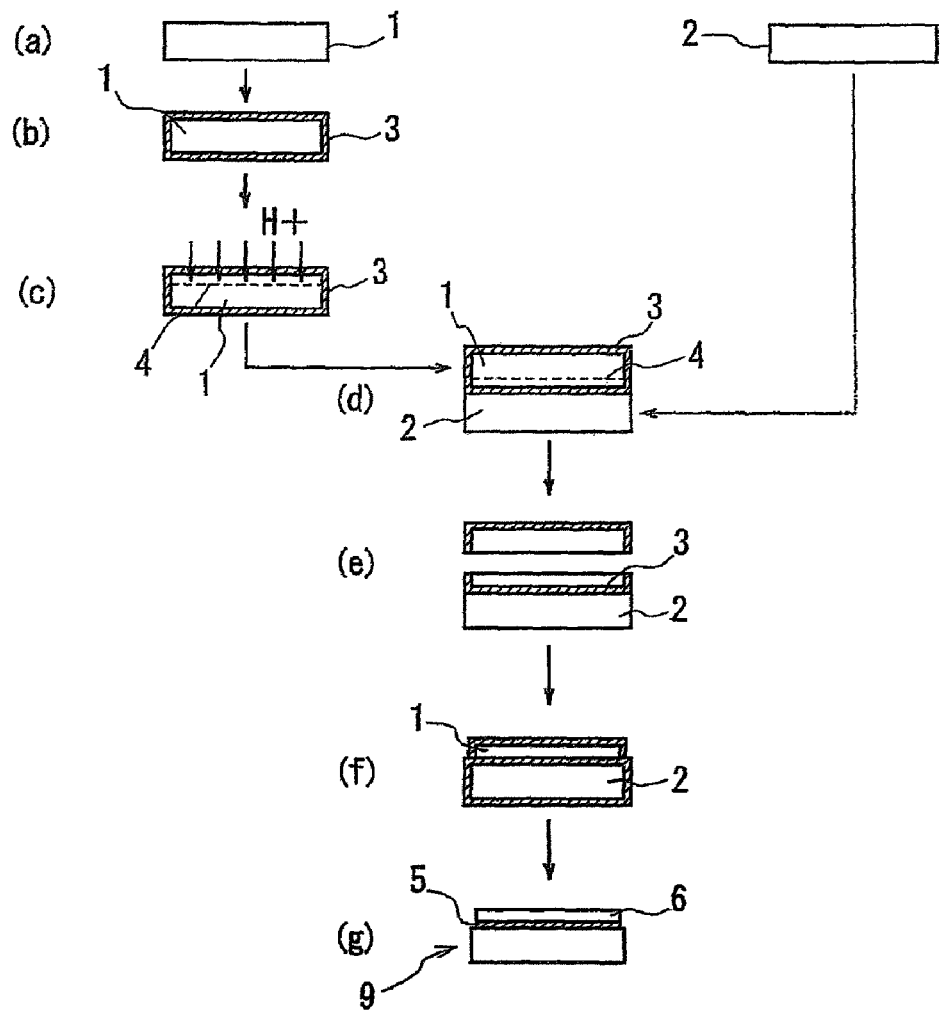
FIG. 1 is a flow chart showing procedures of producing a semiconductor substrate by the conventional lamination process.
Figure 2:
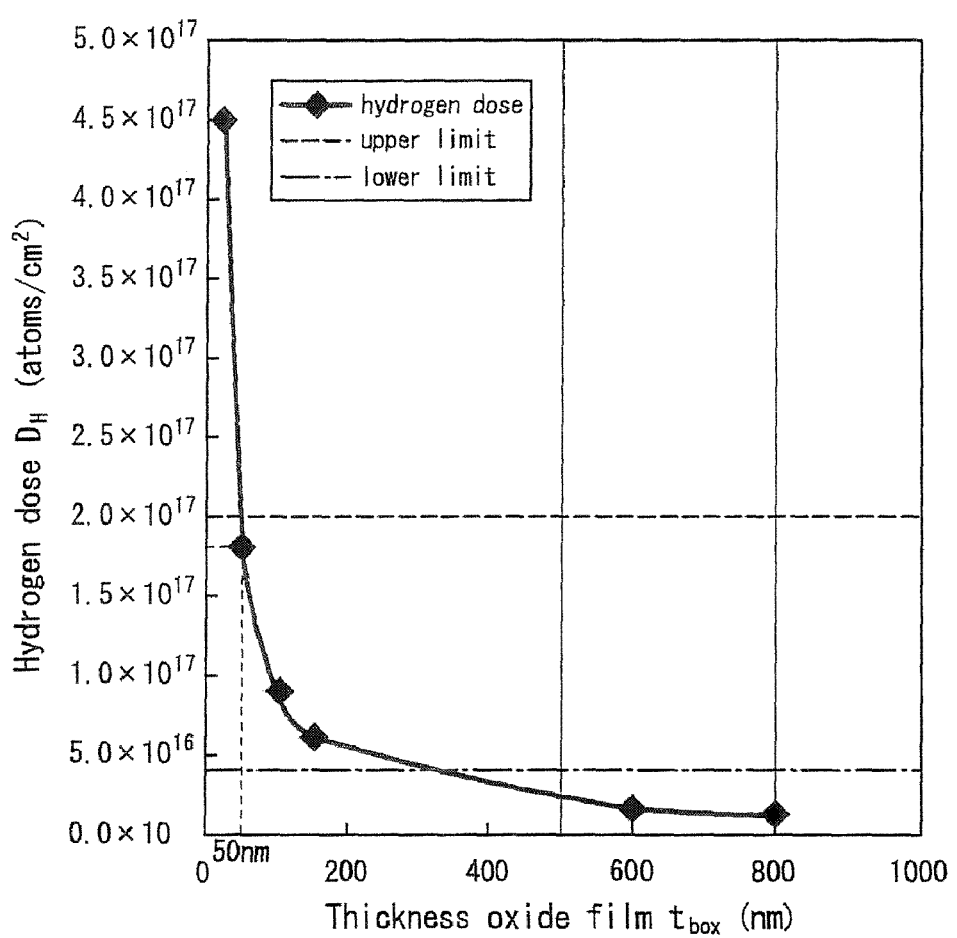
FIG. 2 is a graph showing a hydrogen dose and a thickness range of an oxide film for obtaining a good product.

According to the method shown in FIG. 1, a laminated semiconductor substrate is prepared by forming an oxide film of 150 nm in thickness on the surface of the wafer for the active layer, implanting hydrogen ions so as to come a peak of the implantation dose (ion implanted layer) to a depth position of 500-nm from the surface of the wafer for the active layer, and then laminating the wafer for the active layer to the wafer for the support substrate and conducting the exfoliation heat treatment to exfoliate the wafer for the active layer at the hydrogen ion implanted peak region (ion implanted layer), and thereafter conducting an oxidation treatment and removing the oxide film and conducting the planarization treatment.

Comparative Example 2

According to the method shown in FIG. 1, a laminated semiconductor substrate is prepared by forming an oxide film of 20 nm in thickness on the surface of the wafer for the active layer, implanting hydrogen ions so as to come a peak of the implantation dose (ion implanted layer) to a depth position of 500 nm from the surface of the wafer for the active layer, and laminating the wafer for the active layer to the wafer for the support substrate and conducting the exfoliation heat treatment to exfoliate the wafer for the active layer at the hydrogen ion implanted peak region (ion implanted layer), and thereafter conducting an oxidation treatment and removing the oxide film and conducting the planarization treatment.

Comparative Example 3

According to the method shown in FIG. 1, a laminated semiconductor substrate is prepared by forming an oxide film of 20 nm in thickness on the surface of the wafer for the active layer, implanting hydrogen ions so as to come a peak of the implantation dose (ion implanted layer) to a depth position of 500 nm from the surface of the wafer for the active layer, and then subjecting the surfaces of the wafer for the active layer and the wafer for the support substrate to an oxygen plasma treatment and laminating the wafer for the active layer to the wafer for the support substrate and conducting the exfoliation heat treatment to exfoliate the wafer for the active layer at the hydrogen ion implanted peak region (ion implanted layer), and thereafter conducting an oxidation treatment and removing the oxide film and conducting the planarization treatment.

Invention Example 1

First Invention

According to the method shown in FIG. 3, a laminated semiconductor substrate is prepared by forming an oxide film of 20 mm in thickness on the surface of the wafer for the active layer, implanting hydrogen ions so as to come a peak of the implantation dose (ion implanted layer) to a depth position of 500 nm from the surface of the wafer for the active layer, and further implanting oxygen ions so as to come a peak of the implantation dose to a depth position of 50 nm from the surface of the wafer for the active layer, and laminating the wafer for the active layer at its ion implanted side to the wafer for the support substrate after both the ion implantations, and conducting the exfoliation heat treatment to exfoliate the wafer for the active layer at the hydrogen ion implanted peak region (ion implanted layer), and thereafter conducting an oxidation treatment and removing the oxide film and conducting the planarization treatment.

Invention Example 2

First Invention

According to the method shown in FIG. 3, a laminated semiconductor substrate is prepared by forming an oxide film of 20 nm in thickness on the surface of the wafer for the active layer, implanting hydrogen ions so as to come a peak of the implantation dose (ion implanted layer) to a depth position of 500 nm from the surface of the wafer for the active layer, and further implanting argon ions so as to come a peak of the implantation dose to a depth position of 50 nm from the surface of the wafer for the active layer, and laminating the wafer for the active layer at its ion implanted side to the wafer for the support substrate after both the ion implantations, and conducting the exfoliation heat treatment to exfoliate the wafer for the active layer at the hydrogen ion implanted peak region (ion implanted layer), and thereafter conducting an oxidation treatment and removing the oxide film and conducting the planarization treatment.

Invention Example 3

Second Invention

According to the method shown in FIG. 6, a laminated semiconductor substrate is prepared by forming an oxide film of 20 nm in thickness on the surface of the wafer for the active layer, implanting oxygen ions so as to come a peak of the implantation dose to a depth position of 50 nm from the surface of the wafer for the active layer, and further implanting hydrogen ions so as to come a peak of the implantation dose (ion implanted layer) to a depth position of 500 nm from the surface of the wafer for the active layer, and laminating the wafer for the active layer at its ion implanted side to the wafer for the support substrate after the implantation of both the ions, and conducting the exfoliation heat treatment to exfoliate the wafer for the active layer at the hydrogen ion implanted peak region (ion implanted layer), and thereafter conducting an oxidation treatment and removing the oxide film and conducting the planarization treatment.

Invention Example 4

Second Invention

According to the method shown in FIG. 6, a laminated semiconductor substrate is prepared by forming an oxide film of 20 nm in thickness on the surface of the wafer for the active layer, implanting argon ions so as to come a peak of the implantation dose to a depth position of 50 nm from the surface of the wafer for the active layer, and further implanting hydrogen ions so as to come a peak of the implantation dose (ion implanted layer) to a depth position of 500 nm from the surface of the wafer for the active layer, and laminating the wafer for the active layer at its ion implanted side to the wafer for the support substrate after the implantation of both the ions, and conducting the exfoliation heat treatment to exfoliate the wafer for the active layer at the hydrogen ion implanted peak region (ion implanted layer), and thereafter conducting an oxidation treatment and removing the oxide film and conducting the planarization treatment.

Invention Examples 5-8

In these examples, the same procedures as in Invention Examples 1-4 are repeated, respectively, except that the surfaces of the wafer for the active layer and the wafer for the support substrate are subjected to an oxygen plasma treatment prior to the lamination between the wafer for the active layer and the wafer for the support substrate. Moreover, the plasma treatment is carried out under condition that the wafers are kept for 20 seconds after the interior of the reaction chamber replaced with oxygen gas is rendered into a vacuum state.

With respect to the thus obtained semiconductor substrates, the defect number is visually measured under a high-intensity light-gathering lamp or a fluorescent lamp. The results are shown in Table 2. As seen from Table 2, the occurrence of defects is suppressed in the semiconductor substrates according to the invention even when the buried oxide film is thin or the oxide film is not existent. Moreover, it is preferable to previously implant ions other than hydrogen because when hydrogen ions are previously implanted, the organic substance existing on the surface of the wafer is liable to be fixed on the wafer to fear the occurrence of the blisters. More preferably, the wafer after the implantation of ions other than hydrogen is cleaned to conduct the hydrogen ion implantation.

TABLE 2

| | Thickness of oxide film (nm) | Ion implantation 1 | Ion implantation 2 | Plasma treatment | Defect number (defects/300 mm wafer) |
|---|---|---|---|---|---|
| Comparative Example 1 | 150 | H | — | — | not more than 2 |
| Comparative Example 2 | 20 | H | — | — | 50 |
| Comparative Example 3 | 20 | H | — | ○ | 30 |
| Invention Example 1 | 20 | H | O | — | not more than 10 |
| Invention Example 2 | 20 | O | H | — | not more than 2 |
| Invention Example 3 | 20 | H | Ar | — | not more than 10 |
| Invention Example 4 | 20 | Ar | H | — | not more than 2 |
| Invention Example 5 | 20 | H | O | ○ | not more than 5 |
| Invention Example 6 | 20 | O | H | ○ | not more than 1 |
| Invention Example 7 | 20 | H | Ar | ○ | not more than 5 |
| Invention Example 8 | 20 | Ar | H | ○ | not more than 1 |

What is claimed is:

1. A method of producing a semiconductor substrate, which comprises the steps of: forming an oxide film having a thickness of not more than 50 nm on a wafer for an active layer, wherein the wafer has a surface side on which, a silicon layer is formed as the active layer; implanting ions other than hydrogen into the wafer for the active layer to a position shallower than an exfoliation region of the wafer for the active layer, implanting hydrogen ions into the exfoliation region to form a hydrogen ion implanted layer, laminating the wafer for the active layer through the oxide film to a wafer for a support substrate, and then exfoliating the wafer for the active layer at the hydrogen ion implanted layer;

wherein the implanting of ions other than hydrogen is conducted to sputter a first quantity of oxygen from the oxide film;

wherein the implanting of hydrogen ions is conducted to sputter a second quantity of oxygen from the oxide film;

wherein the hydrogen ions are implanted after the implanting of ions other than hydrogen;

wherein the first quantity of oxygen and the second quantity of oxygen are determined in consideration of total factor number producing an effect of suppressing hydrogen diffusion ($N_D$) expressed by formula (I) and $N_{ID}$ as follows:

$$N_D = N_{HO} + N_{IO} + N_{ID} \quad (I)$$

wherein $N_D$: total factor number producing an effect of suppressing hydrogen diffusion, $N_{HO}$: oxygen introduced into the active layer through hydrogen ion implantation, $N_{IO}$: oxygen introduced into active layer through ion implantation other than hydrogen, $N_{ID}$: defects introduced into active layer through ion implantation other than hydrogen, and $$N_D > 4.2 * 10^{14} \text{ atoms/cm}^2.$$

2. A method of producing a semiconductor substrate according to claim 1, wherein a plasma treatment is carried out prior to the lamination of the wafer for the active layer and the wafer for the support substrate.

* * * * *